(12) United States Patent
Watanabe

(10) Patent No.: US 9,219,474 B2
(45) Date of Patent: Dec. 22, 2015

(54) DRIVER CIRCUIT FOR SWITCHING ELEMENT

(71) Applicant: DENSO CORPORATION, Kariya, Aichi-pref. (JP)

(72) Inventor: Keisuke Watanabe, Aicki-ken (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/331,672

(22) Filed: Jul. 15, 2014

(65) Prior Publication Data

US 2015/0022246 A1     Jan. 22, 2015

(30) Foreign Application Priority Data

Jul. 16, 2013   (JP) .................................. 2013-147320

(51) Int. Cl.
*H03K 17/18* (2006.01)
*G01R 31/02* (2006.01)
*G01R 31/327* (2006.01)

(52) U.S. Cl.
CPC .............. *H03K 17/18* (2013.01); *G01R 31/026* (2013.01); *G01R 31/3277* (2013.01)

(58) Field of Classification Search
CPC ................. H01L 2224/12032; H01L 2924/00; H01L 2924/0002; H05B 33/0884; H05B 33/0806; H05B 33/0812; G06G 2310/0235; G06G 2310/06

USPC .................................. 327/108, 109, 110, 112
See application file for complete search history.

(56) References Cited

U.S. PATENT DOCUMENTS

2013/0015781 A1*   1/2013   Kanemitsu et al. ........... 315/291

FOREIGN PATENT DOCUMENTS

JP          2008-249642          10/2008

* cited by examiner

*Primary Examiner* — John Poos
(74) *Attorney, Agent, or Firm* — Nixon & Vanderhye PC

(57) ABSTRACT

A driver circuit is connected to a control terminal of a voltage-controlled switching element via a connection line. The drive circuit drives the switching element. The switching element is switched to an ON state by charging the control terminal of the switching element via the connection line. The switching element is switched to an OFF state by discharging the control terminal of the switching element via the connection line. A voltage at a predetermined position on the connection line is detected. An open circuit state between the control terminal and the predetermined position is detected based on a speed of change in the detected voltage at the predetermined position when the switching element is switched to the ON state or the OFF state.

20 Claims, 2 Drawing Sheets

_(1)_

DRIVER CIRCUIT FOR SWITCHING ELEMENT

CROSS-REFERENCE TO RELATED APPLICATION

This application is based on and claims the benefit of priority from Japanese Patent Application No. 2013-147320, filed Jul. 16, 2013, the disclosure of which is incorporated herein in its entirety by reference.

BACKGROUND

1. Technical Field

The present invention relates to a driver circuit for a voltage-controlled switching element.

2. Related Art

JP-A-2008-249642 discloses a detection circuit having an electrical configuration that includes a potential supply unit, an internal circuit, and a supply path. The potential supply unit outputs a predetermined potential obtained by a potential of an external power source and ground potential being divided by a resistor element. The internal circuit is an integrated circuit or the like. The supply path connects the potential supply unit and the internal circuit. In this electrical configuration, the detection circuit detects an open circuit state between the potential supplying unit and the supply path.

When the open circuit state occurs, the potential at the connection point between the supply path and the internal circuit differs from the potential when the potential supply unit and the supply path are connected normally. Therefore, the detection circuit compares the potential at the connection point (potential detection position) between the supply path and the internal circuit with a predetermined reference potential. Thus, the detection circuit detects the open circuit state between the potential supply unit and the supply path.

A driver circuit for a voltage-controlled switching element is known in related art. This driver circuit is connected to a control terminal of the voltage-controlled switching element via a connection line. In this configuration, an open circuit state between the control terminal and the connection line is required to be detected. Here, application of the detection circuit described in JP-A-2008-249642 may be considered. However, even when the detection circuit described in JP-A-2008-249642 is applied, the open circuit state between the control terminal and the potential detection position on the connection line cannot be detected. In particular, a state in which the connection line is not connected to the control terminal cannot be detected.

At present, the open circuit state between the control terminal of the voltage-controlled switching element and the connection line, or in other words, the open circuit state between the control terminal and the driver circuit is detected based on a detection value from a current sensor. The detection value is obtained by a current that is sent to the switching element. Therefore, a problem occurs in that, unless the current is sent to the switching element, the open circuit state between the control terminal and the driver circuit cannot be detected.

SUMMARY

It is thus desired to provide a driver circuit for a switching element that is capable of detecting an open circuit state between a control terminal of a voltage-controlled switching element and a driver circuit.

An exemplary embodiment provides a driver circuit for a switching element that is connected to a control terminal of a voltage-controlled switching element via a connection line and drives the switching element. The driver circuit for a switching element includes: charging means, discharging means, voltage detecting means and open circuit detecting means. The charging means switches the element to an ON state by charging the control terminal of the switching element via the connection line. The discharging means switches the switching element to an OFF state by discharging the control terminal of the switching element via the connection line. The voltage detecting means detects the voltage at a predetermined position on the connection line. The open circuit detecting means detects an open circuit state between the control terminal and the predetermined position based on the speed of change in the voltage at the predetermined position detected by the voltage detecting means when the switching element is switched to the ON state or the OFF state.

In the present disclosure, the voltage-controlled switching element is switched to the ON state when the control terminal of the switching element is charged with electrical charge from the driver circuit via the connection line. In addition, the switching element is switched to the OFF state when electrical charge is discharged from the control terminal of the switching element to the driver circuit via the connection line. The voltage at a predetermined position on the connection line is detected when the switching element is switched to the ON state or the OFF state. An open circuit state between the control terminal of the switching element and the predetermined position on the connection line is detected based on the speed of change in the detected voltage.

When the control terminal and the connection line are connected normally, the voltage at the predetermined position on the connection line is the same as the voltage applied to the control terminal from the driver circuit via the connection line. On the other hand, even when the connection between the control terminal and the predetermined position on the connection line is in an open circuit state, the voltage at the predetermined position is the same as the voltage applied to the control terminal when the connection is normal.

However, the inventors of the present disclosure have discovered that the speed of change in the voltage at the predetermined position when the switching element is switched to the ON state or the OFF state differs between normal connection and when the connection between the control terminal and the predetermined position on the connection line is in the open circuit state. Specifically, the inventors of the present disclosure have discovered that, as a result of the capacitance present between the control terminal and another terminal of the switching element, the voltage at the predetermined position increases or decreases more gradually when the connection is normal, compared to when the connection between the control terminal and the predetermined position is in an open circuit state.

Therefore, the open circuit state between the control terminal and the predetermined position on the connection line can be detected based on the speed of change in the voltage at the predetermined position when the switching element is switched to the ON state or the OFF state. In other words, the open circuit state between the control terminal of the switching element and the driver circuit can be detected.

DESCRIPTION OF THE EMBODIMENTS

An embodiment of a driver circuit for a switching element used to drive an insulated-gate bipolar transistor (IGBT) will hereinafter be described with reference to the drawings.

Figure 1:
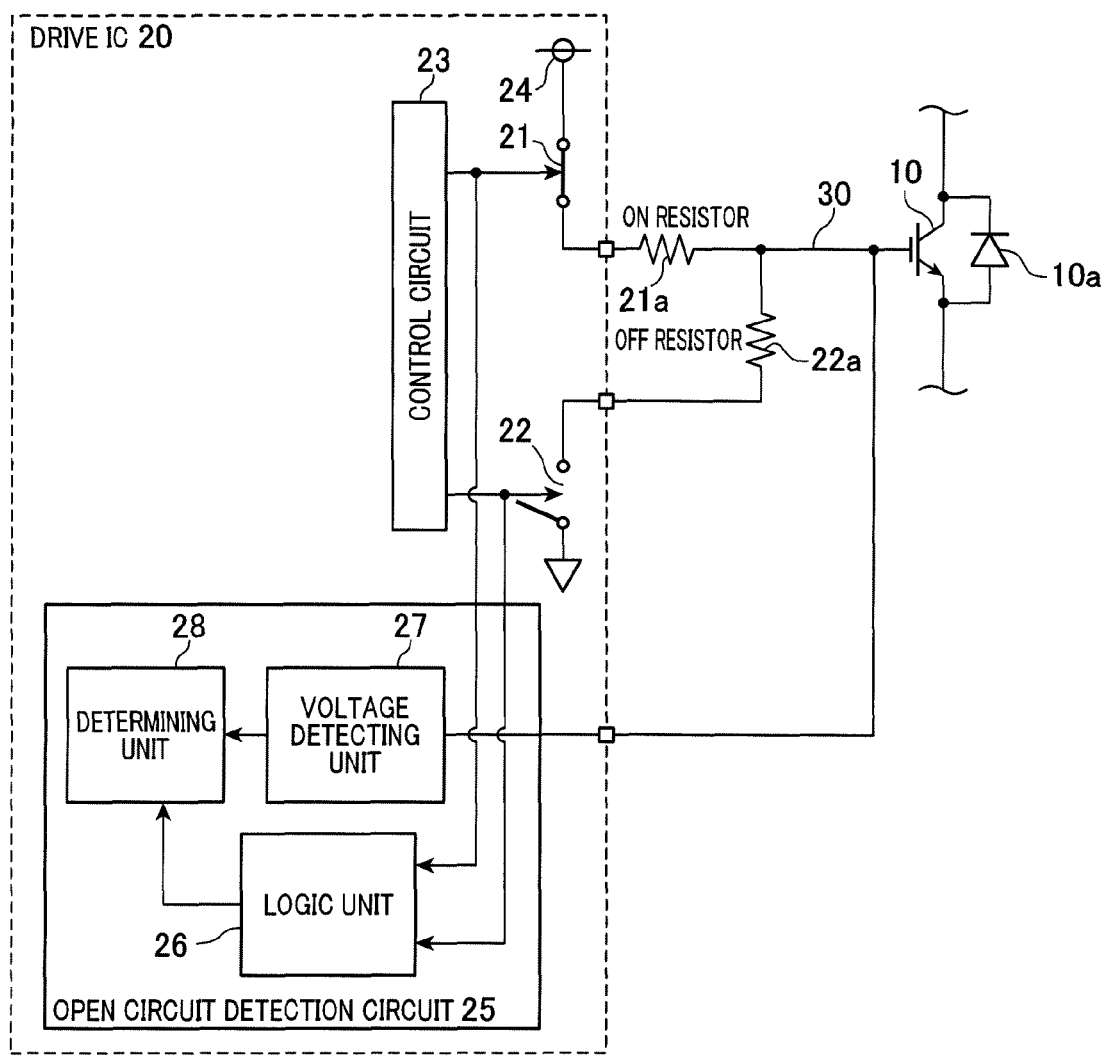
FIG. 1 is a diagram of a configuration of a driver circuit of a switching element according to an embodiment.

First, an electrical configuration including a drive integrated circuit (IC) 20 (driver circuit for a switching element) according to the present embodiment will be described with reference to FIG. 1. The drive IC 20 includes an ON-drive switching element 21, an OFF-drive switching element 22, a control circuit 23, a drive power source 24, and an open circuit detection circuit 25. The drive IC 20 is connected to a gate terminal (control terminal) of an IGBT 10 (switching element) by a connection line 30. A charging means is configured by the ON-drive switching element 21, the control circuit 23, and the drive power source 24. A discharging means is configured by the OFF-drive switching element 22 and the control circuit 23.

The IGBT 10 is a voltage-controlled switching element that is driven by the voltage applied to the gate terminal being controlled. The gate terminal of the IGBT 10 is connected to the drive IC 20 by the connection line 30. A free-wheeling diode 10a is connected between a collector terminal and an emitter terminal of the IGBT 10. The free-wheeling diode 10a is connected so that the direction from the emitter terminal to the collector terminal is a forward direction.

The connection line 30 includes an ON resistor 21a and an OFF resistor 22a. The connection line 30 connects the drive IC 20 and the gate terminal of the IGBT 10. Specifically, one end of the ON resistor 21a is connected to the ON-drive switching element 21, described hereafter. The other end of the ON resistor 21a is connected to one end of the OFF resistor 22a. The other end of the OFF resistor 22a is connected to the OFF-drive switching element 22, described hereafter. The connection line 30 connects the connection point between the ON resistor 21a and the OFF resistor 22a to the gate terminal of the IGBT 10.

The ON-drive switching element 21 charges the gate terminal of the IGBT 10 with electrical charge by being turned ON by input from the control circuit 23. The ON-drive switching element 21 is, for example, a P-channel metal-oxide semiconductor field-effect transistor (MOSFET). The ON-drive switching element 21 is connected between a positive terminal of the drive power source 24 and the ON resistor 21a of the connection line 30.

When the ON-drive switching element 21 is turned ON, current can be carried between the drive power source 24 and the gate terminal of the IGBT 10. The gate terminal of the IGBT 10 is charged with electrical charge via the connection line 30. When the gate voltage becomes higher than an ON/OFF threshold, the IGBT 10 is switched from an OFF state to an ON state. On the other hand, when the ON-drive switching element 21 is turned OFF, the connection between the drive power source 24 and the connection line 30 becomes in an open circuit state. Electrical charge is no longer supplied to the gate terminal of the IGBT 10.

The OFF-drive switching element 22 discharges electrical charge from the gate terminal of the IGBT 10 by being turned ON by input from the control circuit 23. The OFF-drive switching element 22 is, for example, an N-channel MOS-FET. The OFF-drive switching element 22 is connected between the OFF resistor 22a of the connection line 30 and the ground.

When the OFF-drive switching element 22 is turned ON, current can be carried between the ground and the gate terminal of the IGBT 10. Electrical charge is discharged from the gate terminal of the IGBT 10. When the gate voltage becomes lower than the ON/OFF threshold, the IGBT 10 switches from the ON state to the OFF state. On the other hand, when the OFF-drive switching element 22 is turned OFF, the connection between the ground and the connection line 30 becomes in an open circuit state. Electrical charge is no longer discharged from the gate terminal of the IGBT 10.

The control circuit 23 turns ON the ON-drive switching element 21 when a drive signal inputted from an external source to the drive IC 20 instructs that the IGBT 10 be turned ON. In addition, when the drive signal inputted from the external source to the drive IC 20 ends the instruction to turn ON the IGBT 10, the control circuit 23 turns OFF the ON-drive switching element 21 and turns ON the OFF-drive switching element 22.

The open circuit detection circuit 25 (corresponding to open circuit detecting means) includes a logic unit 26, a voltage detecting unit 27 (voltage detecting means), and a determining unit 28. The open circuit detection circuit 25 detects an open circuit state between a predetermined position on the connection line 30 and the gate terminal of the IGBT 10.

The logic unit 26 detects the timing at which the ON-drive switching element 21 is turned ON, based on a control line from the control circuit 23 to the ON-drive switching element 21. In other words, the logic unit 26 detects the timing at which the IGBT 10 is switched to the ON state. In addition, the logic unit 26 also detects the timing at which the OFF-drive switching element 22 is turned ON, based on a control line from the control circuit 23 to the OFF-drive switching element 22. In other words, the logic unit 26 also detects the timing at which the IGBT 10 is switched to the OFF state.

The voltage detecting unit 27 detects the voltage at the predetermined position on the connection line 30. Specifically, the voltage detecting unit 27 detects the changes over time in the voltage across the connection point between the ON resistor 21a and the OFF resistor 22a and the gate terminal of the IGBT 10.

The determining unit 28 acquires the timing at which the IGBT 10 is switched to the ON state or the OFF state, detected by the logic unit 26. The determining unit 28 also acquires the changes over time in the voltage at the predetermined position on the connection line 30, detected by the voltage detecting unit 27. The determining unit 28 then determines whether or not the connection between the gate terminal of the IGBT 10 and the predetermined position on the connection line 30 is in an open circuit state, based on the timing at which the IGBT 10 is switched to the ON state or the OFF state and the changes over time in the voltage at the predetermined position on the connection line 30. Details of the method for detecting the open circuit state will be described hereafter.

Figure 2A:
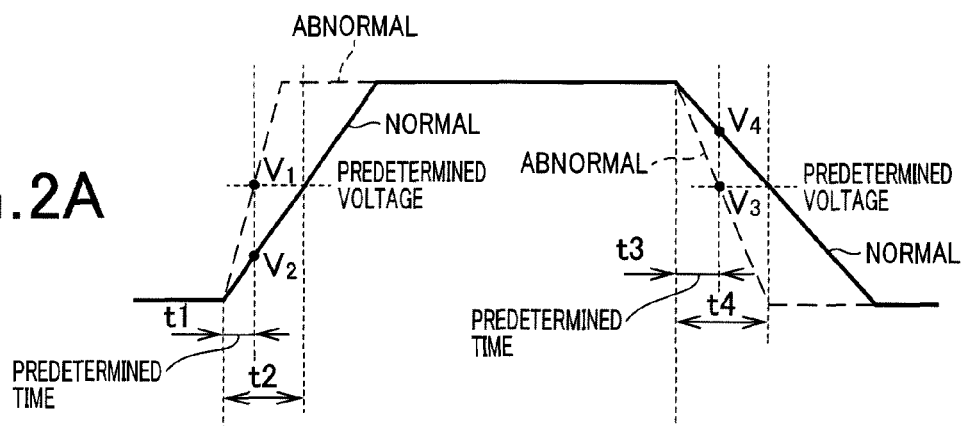
FIGS. 2A and 2B are time charts indicating changes over time in a voltage detected at a predetermined position on a connection line and in a drive signal for the switching element.
Figure 2B:
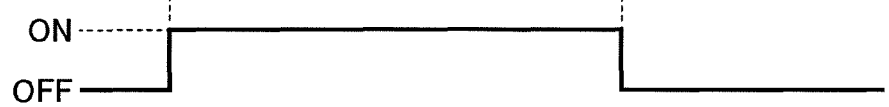

Next, the method for determining the open circuit state between the drive IC 20 and the IGBT 10 will be described with reference to FIGS. 2A and 2B. FIG. 2A indicates the changes over time in the voltage detected at the predetermined position on the connection line 30. The solid line indicates the changes over time in the detected voltage when the gate terminal of the IGBT 10 and the connection line 30 are connected normally. The broken line indicates the changes over time in the detected voltage when the connection between the gate terminal of the IGBT 10 and the predetermined position on the connection line 30 is in an open circuit state. In addition, FIG. 2B indicates the drive signal for the IGBT 10.

Even when the connection between the gate terminal of the IGBT 10 and the predetermined position of the connection line 30 is in an open circuit state, the voltage at the predetermined position on the connection line 30 is the same as the voltage applied to the gate terminal of the IGBT 10 when the gate terminal and the connection line 30 are connected normally.

In other words, the voltage at the predetermined position on the connection line 30 is converged to the same voltage, regardless of whether the gate terminal of the IGBT 10 and the connection line 30 are connected normally, or the connection between the gate terminal of the IGBT 10 and the predetermined position on the connection line 30 is in an open circuit state.

However, because capacitance is present between the gate terminal and the emitter terminal of the IGBT 10, as shown in FIG. 2A, the voltage changes more gradually when the gate terminal of the IGBT 10 and the connection line 30 are connected normally, compared to when the connection between the gate terminal and the predetermined position is in an open circuit state.

Specifically, when the gate terminal of the IGBT 10 and the connection line 30 are connected normally, the voltage detected at the predetermined position when the IGBT 10 is switched from the OFF state to the ON state increases more gradually than when the connection between the gate terminal and the predetermined position is in an open circuit state.

In addition, when the gate terminal of the IGBT 10 and the connection line 30 are connected normally, the voltage detected at the predetermined position when the IGBT 10 is switched from the ON state to the OFF state decreases more gradually than when the connection between the gate terminal and the predetermined position is in an open circuit state.

Therefore, the determining unit 28 determines whether or not the connection between the gate terminal of the IGBT 10 and the predetermined position is in an open circuit state based on the speed of change in the voltage detected at the predetermined position when the IGBT 10 is switched to the ON state or the OFF state.

Then, when determined that the connection between the gate terminal of the IGBT 10 and the predetermined position is in an open circuit state, the determining unit detects the open circuit state between the gate terminal and the predetermined position. In other words, the determining unit 28 detects the open circuit state between the gate terminal of the IGBT 10 and the predetermined position based on the speed of increase in the voltage at the predetermined position when the IGBT 10 is switched to the ON state, or the speed of decrease in the voltage at the predetermined position when the IGBT 10 is switched to the OFF state.

Specifically, the open circuit state between the gate terminal of the IGBT 10 and the predetermined position is detected based on the voltage at the predetermined position on the connection line 30 after an elapse of a predetermined amount of time from when the switching of the IGBT 10 to the ON state or the OFF state is started, or in other words, from when the ON-drive switching element 21 or the OFF-drive switching element 22 is turned ON.

When the connection between the gate terminal of the IGBT 10 and the predetermined position on the connection line 30 is in an open circuit state, voltage V1 at the predetermined position after the elapse of the predetermined amount of time from when the switching of the IGBT 10 to the ON state is started is higher than voltage V2 when the gate terminal of the IGBT 10 and the connection line 30 are connected normally.

Therefore, when the voltage V1 at the predetermined position is higher than a first threshold voltage after the elapse of the predetermined amount of time from when the switching of the IGBT 10 to the ON state is started, the open circuit state between the gate terminal and the predetermined position is detected. The first threshold voltage is set to a higher value than the voltage V2 at the predetermined position after the elapse of the predetermined amount of time from when the switching of the IGBT 10 to the ON state is started when the gate terminal of the IGBT 10 and the connection line 30 are connected normally.

In addition, when the connection between the gate terminal of the IGBT 10 and the predetermined position on the connection line 30 is in an open circuit state, voltage V3 at the predetermined position after the elapse of the predetermined amount of time from when the switching of the IGBT 10 to the OFF state is started is lower than voltage V4 when the gate terminal of the IGBT 10 and the connection line 30 are connected normally.

Therefore, when the voltage V3 at the predetermined position is lower than a second threshold voltage after the elapse of the predetermined amount of time from when the switching of the IGBT 10 to the OFF state is started, the open circuit state between the gate terminal and the predetermined position is detected. The second threshold voltage is set to a lower value than the voltage V4 at the predetermined position after the elapse of the predetermined amount of time from when the switching of the IGBT 10 to the OFF state is started when the gate terminal of the IGBT 10 and the connection line 30 are connected normally.

Alternatively, the open circuit state between the gate terminal and the predetermined position is detected based on the amount of time required for the voltage at the predetermined position to reach a predetermined voltage from when the switching of the IGBT 10 to the ON state or the OFF state is started.

When the connection between the gate terminal of the IGBT 10 and the predetermined position on the connection line 30 is in an open circuit state, time t1 from when the switching of the IGBT 10 to the ON state is started until the voltage at the predetermined position increases to the predetermined voltage is shorter than time t2 when the gate terminal of the IGBT 10 and the connection line 30 are connected normally.

Therefore, when the time t1 from when the switching of the IGBT 10 to the ON state is started until the voltage at the predetermined position increases to the predetermined voltage is shorter than a first threshold, the open circuit state between the gate terminal and the predetermined position is detected. The first threshold is set to a shorter amount of time than the time t2 from when the switching of the IGBT 10 to the ON state is started until the voltage at the predetermined position increases to the predetermined voltage when the gate terminal of the IGBT 10 and the connection line 30 are connected normally.

In addition, when the connection between the gate terminal of the IGBT 10 and the predetermined position on the connection line 30 is in an open circuit state, time t3 from when the switching of the IGBT 10 to the OFF state is started until the voltage at the predetermined position decreases to a predetermined voltage is shorter than time t4 when the gate terminal of the IGBT 10 and the connection line 30 are connected normally.

Therefore, when the time t3 from when the switching of the IGBT 10 to the OFF state is started until the voltage at the predetermined position decreases to the predetermined voltage is shorter than a second threshold, the open circuit state between the gate terminal and the predetermined position is detected. The second threshold is set to a shorter amount of time than the time t4 from when the switching of the IGBT 10 to the OFF state is started until the voltage at the predetermined position decreases to the predetermined voltage when the gate terminal of the IGBT 10 and the connection line 30 are connected normally.

In general, the speed of change in the voltage detected at the predetermined position on the connection line 30 is faster when the IGBT 10 is switched to the ON state compared to when the IGBT 10 is switched to the OFF state.

Therefore, when a quick detection of the open circuit state between the gate terminal of the IGBT 10 and the predetermined position on the connection line 30 is desired, the detection should be made based on the speed of change in the voltage at the predetermined position when the IGBT 10 is switched to the ON state. On the other hand, when a careful detection of the open circuit state is desired, the detection should be made based on the speed of change in the voltage at the predetermined position when the IGBT 10 is switched to the OFF state.

According to the above-described embodiment, the following effects are achieved.

(i) The open circuit state between the gate terminal of the IGBT 10 and the predetermined position on the connection line 30 can be detected based on the speed of change in the voltage at the predetermined position on the connection line 30 when the IGBT 10 is switched to the ON state or the OFF state. In other words, the open circuit state between the gate terminal of the IGBT 10 and the drive IC 20 can be detected.

(ii) When the connection between the gate terminal of the IGBT 10 and the predetermined position on the connection line 30 is in an open circuit state, the voltage at the predetermined position after the elapse of a predetermined amount of time from when switching of the IGBT 10 to the ON state is started is higher than when the gate terminal of the IGBT 10 and the connection line 30 are connected normally. In addition, the connection between the gate terminal of the IGBT 10 and the predetermined position on the connection line 30 is in an open circuit state, the voltage at the predetermined position after the elapse of the predetermined amount of time from when switching of the IGBT 10 to the OFF state is started is lower than when the gate terminal of the IGBT 10 and the connection line 30 are connected normally.

Therefore, the open circuit state between the gate terminal of the IGBT 10 and the predetermined position on the connection line 30 can be detected based on the voltage at the predetermined position after the elapse of the predetermined amount of time from when the switching of the IGBT 10 to the ON state or the OFF state is started.

(iii) When the connection between the gate terminal of the IGBT 10 and the predetermined position on the connection line 30 is in an open circuit state, the amount of time until the voltage at the predetermined position increases or decreases to a predetermined voltage is shorter than when the gate terminal of the IGBT 10 and the connection line 30 are connected normally.

Therefore, the open circuit state between the gate terminal of the IGBT 10 and the predetermined position on the connection line 30 is detected when the amount of time from when the switching of the IGBT 10 to the ON state or the OFF state is started until the voltage at the predetermined position on the connection line 30 reaches the predetermined voltage is shorter than a threshold.

Other Embodiments

The open circuit state between the gate terminal of the IGBT 10 and the predetermined position on the connection line 30 may be detected based on the speed of change in the voltage at the predetermined position on the connection line 30 both when the IGBT 10 is switched to the ON state and when the IGBT 10 is switched to the OFF state. As a result, the open circuit state between the gate terminal of the IGBT 10 and the predetermined position on the connection line 30 can be more accurately detected.

In this instance, the open circuit state may be detected based on the voltage at the predetermined position after the elapse of a predetermined amount of time from the start of switching when the IGBT 10 is switched to one of either the ON state or the OFF state. The open circuit state may be detected based on the amount of time required for the voltage at the predetermined position to reach a predetermined voltage from the start of switching when the IGBT 10 is switched to the other of either the ON state or the OFF state.

The drive IC 20 may be a circuit that drives a switching element other than the IGBT 10, such as a MOSFET.

What is claimed is:

1. A driver circuit, connected to a control terminal of a voltage-controlled switching element via a connection line, for driving the switching element, the driver circuit comprising:
   charging means that switches the switching element to an ON state by charging the control terminal of the switching element via the connection line;
   discharging means that switches the switching element to an OFF state by discharging the control terminal of the switching element via the connection line;
   voltage detecting means that detects a voltage at a predetermined position on the connection line; and
   open circuit detecting means that detects an open circuit state between the control terminal and the predetermined position based on a speed of change in the voltage at the predetermined position detected by the voltage detecting means when the switching element is switched to the ON state or the OFF state.

2. The driver circuit according to claim 1, wherein
   the open circuit detecting means detects an open circuit state between the control terminal and the predetermined position based on the voltage at the predetermined position on the connection line after an elapse of a predetermined amount of time from when the switching of the switching element to the ON state or the OFF state is started.

3. The driver circuit according to claim 1, wherein
   the open circuit detecting means detects an open circuit state between the gate terminal and the predetermined position when a time from when the switching of the switching element to the ON state or the OFF is started until the voltage at the predetermined position increases to the predetermined voltage is shorter than a predetermined threshold.

4. The driver circuit according to claim 1, wherein
   the open circuit detecting means detects an open circuit state between the gate control terminal and the predetermined position based on both when the switching element is switched to the ON state and when the switching element is switched to the OFF state.

5. The driver circuit according to claim 2, wherein
the open circuit detecting means detects an open circuit state between the gate terminal and the predetermined position when a time from when the switching of the switching element to the ON state or the OFF is started until the voltage at the predetermined position increases to the predetermined voltage is shorter than a predetermined threshold.

6. The driver circuit according to claim 2, wherein
the open circuit detecting means detects an open circuit state between the gate control terminal and the predetermined position based on both when the switching element is switched to the ON state and when the switching element is switched to the OFF state.

7. The driver circuit according to claim 3, wherein
the open circuit detecting means detects an open circuit state between the gate control terminal and the predetermined position based on both when the switching element is switched to the ON state and when the switching element is switched to the OFF state.

8. The driver circuit according to claim 5, wherein
the open circuit detecting means detects an open circuit state between the gate control terminal and the predetermined position based on both when the switching element is switched to the ON state and when the switching element is switched to the OFF state.

9. A method for driving a voltage-controlled switching element by a driver circuit that is connected to a control terminal of the switching element via a connection line, the method comprising:
switching, by the driver circuit, the switching element to an ON state by charging the control terminal of the switching element via the connection line;
switching, by the driver circuit, the switching element to an OFF state by discharging the control terminal of the switching element via the connection line;
detecting, by the driver circuit, a voltage at a predetermined position on the connection line; and
detecting, by the driver circuit, an open circuit state between the control terminal and the predetermined position is in an open circuit state based on a speed of change in the detected voltage at the predetermined position when the switching element is switched to the ON state or the OFF state.

10. The method of claim 9, wherein
an open circuit state is detected between the control terminal and the predetermined position based on the voltage at the predetermined position on the connection line after an elapse of a predetermined amount of time from when the switching of the switching element to the ON state or the OFF state is started.

11. The method of claim 9, wherein
an open circuit state is detected between the gate terminal and the predetermined position when a time from when the switching of the switching element to the ON state or the OFF is started until the voltage at the predetermined position increases to the predetermined voltage is shorter than a predetermined threshold.

12. The method of claim 9 wherein
an open circuit state is detected between the gate control terminal and the predetermined position based on both when the switching element is switched to the ON state and when the switching element is switched to the OFF state.

13. The method of claim 10, wherein
an open circuit state is detected between the gate terminal and the predetermined position when a time from when the switching of the switching element to the ON state or the OFF is started until the voltage at the predetermined position increases to the predetermined voltage is shorter than a predetermined threshold.

14. The method of claim 10, wherein
an open circuit state is detected between the gate control terminal and the predetermined position based on both when the switching element is switched to the ON state and when the switching element is switched to the OFF state.

15. The method of claim 11, wherein
an open circuit state is detected between the gate control terminal and the predetermined position based on both when the switching element is switched to the ON state and when the switching element is switched to the OFF state.

16. The method of claim 13, wherein
an open circuit state is detected between the gate control terminal and the predetermined position based on both when the switching element is switched to the ON state and when the switching element is switched to the OFF state.

17. The method of claim 9 wherein the voltage at the predetermined position changes more gradually when a connection between the control terminal and the predetermined position is normal as compared to when the connection between the control terminal and the predetermined position is in an open circuit state.

18. The driver circuit according to claim 1, wherein the voltage at the predetermined position changes more gradually when a connection between the control terminal and the predetermined position is normal as compared to when the connection between the control terminal and the predetermined position is in an open circuit state.

19. A driver circuit, connected to a control terminal of a voltage-controlled switching element via a connection line, for driving the switching element, the driver circuit comprising:
a charger circuit configured to switch the switching element to an ON state by charging the control terminal of the switching element via the connection line;
a discharger circuit configured to switch the switching element to an OFF state by discharging the control terminal of the switching element via the connection line;
a voltage detector configured to detect a voltage at a predetermined position on the connection line; and
an open circuit detector configured to detect an open circuit state between the control terminal and the predetermined position based on a speed of change in the voltage at the predetermined position detected by the voltage detector when the switching element is switched to the ON state or the OFF state.

20. The driver circuit according to claim 19, wherein the voltage at the predetermined position changes more gradually when a connection between the control terminal and the predetermined position is normal as compared to when the connection between the control terminal and the predetermined position is in an open circuit state.

* * * * *